(12) United States Patent
Kobayashi

(10) Patent No.: US 6,629,366 B1
(45) Date of Patent: Oct. 7, 2003

(54) METHOD OF PRODUCING A MULTILAYER WIRING BOARD

(75) Inventor: Kazutaka Kobayashi, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 09/548,605

(22) Filed: Apr. 13, 2000

(30) Foreign Application Priority Data

Apr. 15, 1999 (JP) ............................................. 11-107757

(51) Int. Cl.[7] .................................................. H05K 3/10
(52) U.S. Cl. ............................ 29/846; 29/830; 29/840; 29/852
(58) Field of Search .......................... 29/825, 827, 829, 29/830, 840, 846, 847, 852

(56) References Cited

U.S. PATENT DOCUMENTS

| | | | | |
|---|---|---|---|---|
| 4,522,667 A | * | 6/1985 | Hanson et al. | |
| 5,282,312 A | * | 2/1994 | DiStefano et al. | |
| 5,426,849 A | * | 6/1995 | Kimbara et al. | |
| 5,432,999 A | * | 7/1995 | Cappa et al. | |
| 5,436,062 A | * | 7/1995 | Schmidt et al. | |
| 5,570,504 A | * | 11/1996 | DiStefano et al. | |
| 6,228,511 B1 | * | 5/2001 | Sachdev et al. | |
| 6,320,140 B1 | * | 11/2001 | Enomoto | |

* cited by examiner

Primary Examiner—Carl J. Arbes
(74) Attorney, Agent, or Firm—Pennie & Edmonds LLP

(57) ABSTRACT

A multilayer wiring board having a core substrate and wiring line patterns formed on both faces of the core substrate, the core substrate having conducting members piercing through the core substrate, and members of the wiring line patterns on both faces of the core substrate being connected with each other through the conducting member piercing through the core substrate, wherein the core substrate comprises via columns and conductive structural members, which are formed by plating, and an insulating structural member, which electrically insulates the individual via columns and conductive structural members from each other, the via column piercing through the core substrate and serving as the conducting member for connecting the members of the wiring line patterns on both faces of the core substrate with each other. A method of producing such a multilayer wiring board is also disclosed.

7 Claims, 6 Drawing Sheets

METHOD OF PRODUCING A MULTILAYER WIRING BOARD

BACKGROUND OF THE INVENTION

1. Field of the Invention

The invention relates to a multilayer wiring board using a core substrate and a method of producing the multilayer wiring board.

2. Description of the Related Art

A conventional multilayer wiring board generally has a core substrate and multilayers of wiring line patterns formed on the core substrate by a process such as buildup process. Most core substrates are made up of a woven or unwoven fabric of glass or an organic material impregnated with a resin material such as epoxy, and often called a resin substrate. The core substrate is provided with holes piercing the substrate in the direction of its thickness, and the wiring line patterns on both sides of the core substrate are electrically connected through a conducting member formed on the inside wall of the piercing hole by plating or the like.

When piercing holes are formed in a core substrate, they were hitherto formed by drilling or laser beam machining, after which a conducting member is formed on the inside wall of the piercing hole by electroless and electrolytic plating with copper. When the piercing holes are formed in the core substrate by drilling or laser beam machining, they are made one by one and, accordingly, even if a large-sized resin substrate is used to produce a plurality of core substrates at a batch, there have been problems in terms of processing efficiency and processing cost. Thus, a method of forming the piercing holes by drilling or laser beam machining has technical limitations and limitations in terms of production efficiency even when small holes are formed, and is not useful for a product having piercing holes formed at a high density and in large numbers.

In the case of a resin substrate made up of a woven or an unwoven fabric of glass or an organic material impregnated with a resin material, peeling is caused between the fabric and the resin material by stress and heat during drilling or laser beam machining, resulting in a poor insulation resistance of the substrate, and preventing the formation of piercing holes at a higher density.

SUMMARY OF THE INVENTION

An object of the invention is to provide a multilayer wiring board having conducting members piercing through a core substrate and electrically connecting wiring line patterns on both sides of the core substrate, which members can easily be formed at a high density and in large numbers without subjecting the core substrate to drilling or laser beam machining, and a method suitable for the manufacture of such a multilayer wiring board.

As used herein, the term "wiring line pattern" means a pattern made of a conductive material in the form of a layer to interconnect different electric or electronic elements or components, which may be located on a layer the same as or different from the layer of the wiring line pattern. Typically, the wiring line pattern in the invention includes, as members thereof, a plurality of lines of conductor material, which may have a portion, frequently called a pad, through which the connection of the line and an element or component is achieved. The wiring line pattern in the invention may include only pad members, which have, in general, a circular or polygonal shape, such as circle or square, and which are connected to an element or component of another layer, such as a via or terminal member commonly used for the connection of elements or components present in different layers. In some cases, a group of the ends of via columns (which are described hereinafter) of a core substrate of a multilayer wiring board, which are exposed at a surface of the multilayer wiring board, is regarded as a wiring line pattern.

The invention provides a multilayer wiring board having a core substrate and wiring line patterns formed on both faces of the core substrate, the core substrate having conducting members piercing through the core substrate, and members of the wiring line patterns on both faces of the core substrate being connected with each other through the conducting member piercing through the core substrate, wherein the core substrate comprises via columns and conductive structural members which are formed by plating, and an insulating structural member which electrically insulates the individual via columns and conductive structural members from each other, the via column piercing through the core substrate and serving as the conducting member for connecting the members of the wiring line patterns on both faces of the core substrate with each other.

The core substrate in the multilayer wiring board of the invention can have a plurality of layers each comprising the via columns and the conductive structural members which are insulated from each other by the insulating structural member, the layers being separated from each other by an insulating layer interposed therebetween, and the via columns of adjacent layers being connected with each other by an intermediate via piercing through the interposed insulating layer.

Selected conductive structural members of adjacent layers can be connected with each other.

At least one of the conductive structural members can be used as a power supply layer (or member) or a ground layer (or member).

Preferably, the insulating structural member is formed of a heat resistant resin material.

A multilayer wiring board of the invention can be produced by a method comprising the steps:

forming a patterned resist film on a surface of a conductor substrate, plating the surface of the conductor substrate provided with the patterned resist film using the resist film as a mask and the conductor substrate as an electrical power supply layer, to thereby form via columns and conductive structural members, removing the resist film, making a core substrate by forming a layer of insulating material on the surface of the conductor substrate so as to expose the top faces of the via columns and conductive structural members, the core substrate comprising the via columns, the conductive structural members, and an insulating structural member resulted from the layer of insulating material, forming, on the core substrate, a plurality of layers of wiring line patterns, each of which is separated from the underlying core substrate or layer of wiring line pattern by an insulating layer, and removing the conductor substrate.

One or more members of the wiring line pattern may be connected to the conductive structural member of the core substrate.

It is also possible that layers of wiring line patterns are first formed on a surface of a conductor substrate, a core substrate is then formed on the top layer of wiring line pattern, layers of wiring line patterns are then formed on the surface of the core substrate, and the conductor substrate is removed, to thereby produce a multilayer wiring board having a plurality of layers of wiring line patterns on both sides of the core substrate.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein.

DETAILED DESCRIPTION OF THE INVENTION

FIGS. 1A to 1I show an embodiment of the method of manufacturing a multilayer wiring board of the invention. Specifically, the drawings show steps up to the fabrication of a core substrate for a multilayer wiring board. It should be noted that the attached drawings are only for illustration, and parts or members shown therein are not to scale for simplicity.

The method according to the invention uses a substrate of a conductor as a support for producing a core substrate thereon, the conductor substrate also serving as a layer for power supply during subsequent plating. The conductor substrate is then removed by etching to leave the core substrate.

Figure 1A:
FIGS. 1A to 1I schematically show the production of a core substrate for a multilayer wiring board of the invention, FIGS. 2A to 2D schematically show the production of a multilayer wiring board of the invention through the formation of a plurality of wiring line layers.

In FIG. 1A, an aluminum sheet is used as a conductor substrate 10, and on its surface, pads 12, which are subsequently bonded to an external connection terminal, such as those made of a solder ball, are formed. For the formation of the pads 12, a layer of conductor is formed on a surface of the conductor substrate 10 by, for example, plating or sputtering of copper, and the layer is then etched so as to have a predetermined pattern.

In this embodiment, the pads 12 are thus formed first on the surface of the conductor substrate 10 in order to combine the formation of pads, through which a multilayer wiring board is connected to an external electrical circuit, with the formation of the multilayer wiring board. Of course, only the core substrate may be formed from the very first, without forming the pads 12, as described later.

For the conductor substrate 10, a material which can be easily removed from the core substrate is selected because the conductor substrate 10 will be removed by etching or the like after the formation of the core substrate. The aluminum sheet used in this embodiment has advantages of being etched by an etchant different from that used to etch copper, which is a material for the wiring line patterns, and being easily removed by chemical etching.

Figure 1B:
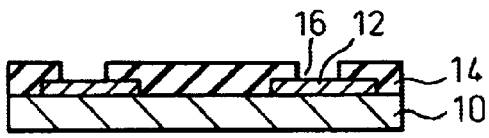

As illustrated in FIG. 1B. a patterned resist film 14 is then formed by coating a photosensitive resist on the surface of the conductor substrate 10 having the pads 12 formed thereon, and exposing and developing the coated resist film, the resist pattern having holes 16 to expose part of the top of the pad 12.

Figure 1C:
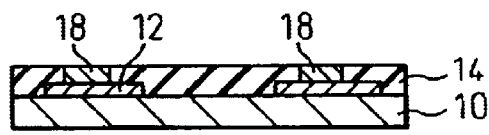

Via bases 18 are then formed in the holes 16 of the patterned resist film 14 by electrolytic plating using the conductor substrate 10 as an electrical power supply layer, as illustrated in FIG. 1C.

Figure 1D:

The resist film 14 is then removed to leave stacks of the pad 12 and the via base 18 on the conductor substrate 10, as illustrated in FIG. 1D.

Figure 1E:

A first insulating layer 20a is then formed by applying an insulating resin to the face of the conductor substrate 10 provided with the pads 12 and via bases 18 to form an insulator layer, and chemically, physically, and/or mechanically removing the insulator material covering the end face of the via base 18 to expose the end face at the surface of the insulator layer, as shown in FIG. 1E. The insulating layer 20a may preferably be made of a resin having good heat resistance and durability, such as epoxy or polyimide. In lieu of applying an insulating resin, a film of insulating resin may be laminated on the face of the conductor substrate 10, provided with the pads 12 and via bases 18, in order to form the insulating layer 20a. Prior to the formation of the layer 20a, the surface of the substrate 10 may be roughened by a black oxide treatment method or the like, as required.

Figure 1F:
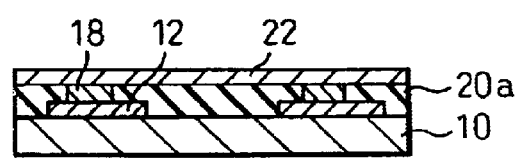

A conductor layer 22 is then formed to cover the surface of the insulating layer 20a including the exposed ends of the via bases 18, as shown in FIG. 1F. The conductor layer 22 may be formed by electroless plating or by sputtering of copper material so as to have, in general, a relatively small thickness, and will serve as an electrical power supply layer for subsequent plating. A sputtered titanium film may be formed before the formation of a sputtered copper film for the conductor layer 22. Prior to the formation of the conductor layer 22, it is preferred that the insulating layer 20a is immersed in a solution of potassium permanganate so as to have a roughened surface. The conductor layer 22 may be electrolytically plated with copper to have a larger thickness, as required.

Figure 1G:
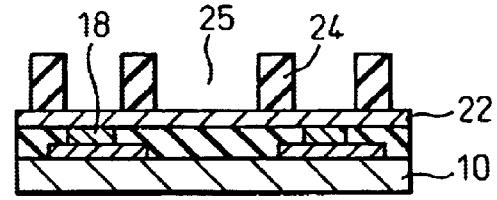

Subsequently, a patterned resist film 24 is formed by coating a photosensitive resist on the surface of the conductor layer 22, and exposing and developing the coated resist film, as shown in FIG. 1G. The formed patterned resist film 24 has openings 25 to partially expose the underlying conductor layer 22. The patterned resist film 24 may be formed by covering the surface of the conductor layer 22 with a film-like photosensitive resist, in lieu of coating with a photosensitive resist. The resist film 24 thus formed will be used to form via columns and conductor structural members, the thickness of which controls a strength of a core substrate to be produced, and is preferred to have a thickness of about 50 micrometers or more. Accordingly, the patterned resist film 24 is designed to have a thickness to create via columns and conductor structural members of the preferred thickness.

Figure 1H:
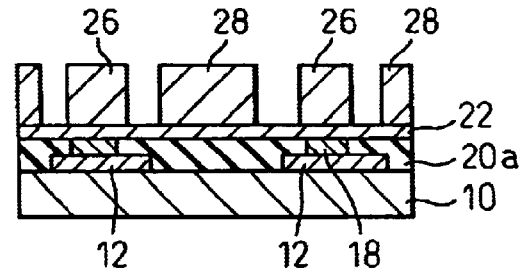

Precursor via columns 26 and precursor conductor structural members 28 are then formed by electrolytically plating exposed parts of the conductor layer 22 with copper using the conductor layer 22 as an electrical power supply layer, and then removing the resist film 24, as shown in FIG. 1H. Prior to the plating, the face of the conductor substrate 10 provided with the resist film 24 is treated by plasma, to enhance the hydrophilic properties of the resist film 24, and remove the residue of resist material on the conductor layer 22, as required.

Subsequently, the side of the conductor substrate 10 having the precursor via columns 26 and the precursor conductor structural members 28 is etched. The etching is terminated when the exposed parts of the conductor layer 22 is completely etched off, to thereby provide finished individual via columns 26' and individual conductor structural members 28' (FIG. 1I) which are electrically isolated from each other, without substantially affecting the thicknesses of the via columns 26' and conductor structural members 28' obtained, because the conductor layer 22 as an electrical power supply layer has a much smaller thickness than that of the precursor via columns 26 and precursor conductor structural members 28. The via column 26' is made up of the precursor via column 26 and the underlying conductor layer 22 (FIG. 1H) remaining after the etching, and the conductor structural member 28' is made up of the precursor conductor structural member 28 and the underlying conductor layer 22 (FIG. 1H) also remaining after the etching.

Figure 1I:
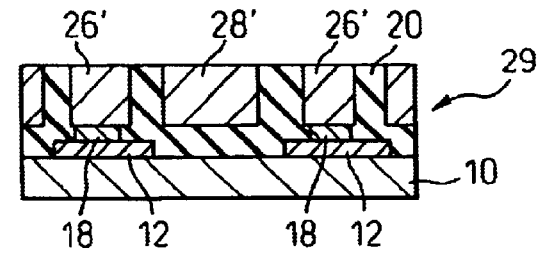

An insulating structural member 20 is then formed by applying an insulating resin, such as epoxy or polyimide, to the face of the conductor substrate 10 provided with the via columns 26' and conductor structural members 28' to form an insulator layer, and chemically, physically, and/or mechanically removing the insulator material covering the end faces of the via columns 26' and conductor structural members 28' to expose them at the surface of the insulating layer, as shown in FIG. 1I. In lieu of applying an insulating resin, a film of insulating resin may be laminated on the face of the conductor substrate 10 provided with the via columns 26' and conductor structural members 28'. In practice, the insulating structural member 20 can be made up of the insulating layer 20a formerly formed in the step illustrated in FIG. 1E and the insulating layer newly formed in the step referred to just above.

Referring to FIG. 1I, a core substrate 29 is thus composed of the combination of conducting members 18, 26' with the conductor structural members 28' and the insulating structural member 20. The conducting members 18, 26' electrically connects a wiring line pattern to be formed on one side of a core substrate with another wiring line pattern formed on the other side of the core substrate 29. The conductor structural member 28' reinforces the core substrate 29 and enhances heat dissipation of a product wiring board, and can also be used as a power supply member or a ground member.

Next, the formation of wiring line patterns on the core substrate is described referring to FIG. 2.

Figure 2A:
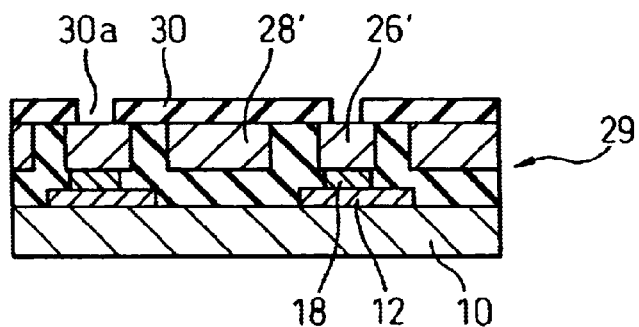

A patterned insulating layer 30 is formed on the surface of the core substrate 29 by applying an insulating resin, such as polyimide, to the surface of the core substrate 29 to form a resin layer, and directing a laser beam to the resin layer so as to open a via hole 30a and expose part of the end face of the via column 26', as illustrated in FIG. 2A. In lieu of the application of insulating resin, a film of insulating resin material may be overlaid on the surface of the core substrate 29. Alternatively, the insulating layer having via holes 30a may be formed by the application of a photosensitive resin, such as photosensitive polyimide or epoxy, followed by exposure and development thereof.

Figure 2B:
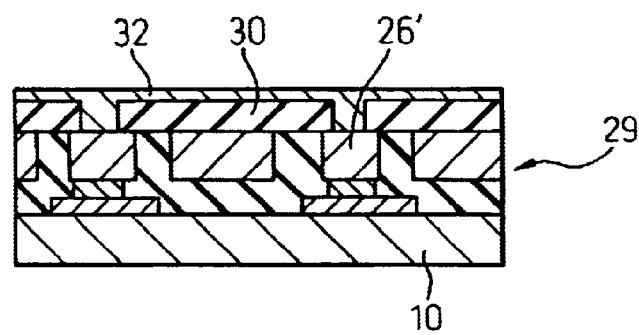

A conductor layer 32 is then formed on the surface of the core substrate 29 provided with the patterned insulating layer 30 by electroless and electrolytic plating with copper, or sputtering and electrolytic plating with copper, as shown in FIG. 2B. In the case of the formation of a sputtered copper film, a sputtered film of a metal, such as titanium, may be formed in advance.

Figure 2C:
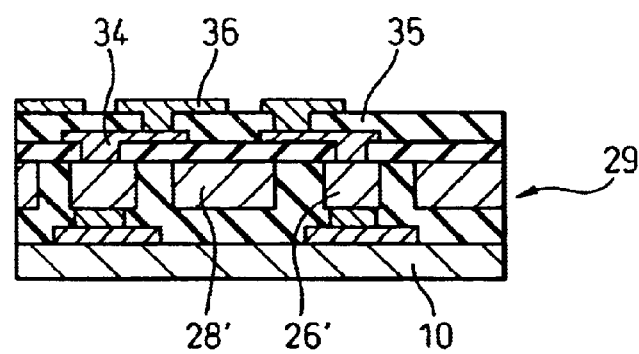

The conductor layer 32 is then etched to provide a patterned wiring line layer 34 (FIG. 2C). Subsequently, the sequence of the steps of from the formation of patterned insulation layer to the formation of patterned wiring line layer as described above is repeated, to form a patterned insulation layer 35 and a patterned wiring line layer 36, as illustrated in FIG. 2C. The sequence of the steps of from the formation of patterned insulation layer to the formation of patterned wiring line layer may be repeated until a predetermined number of patterned wiring line layers are obtained.

Figure 2D:
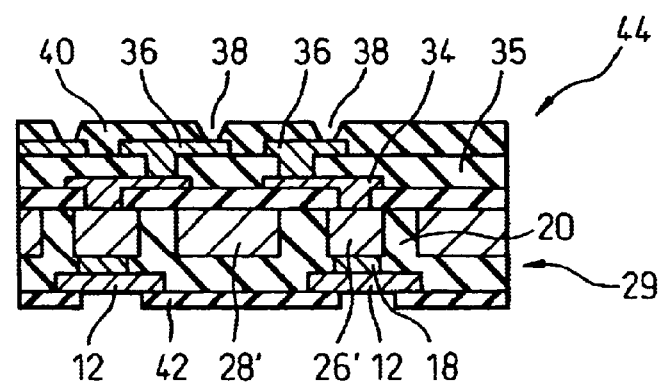

As illustrated in FIG. 2D, a multilayer wiring board 44 of the invention is then obtained by covering the uppermost wiring line layer 36 with a solder resist layer 40 except for portions 38 to be bonded to a pad of a semiconductor element subsequently mounted on the multilayer wiring board 44, and by removing the conductor substrate 10 (FIG. 2C) by etching, and covering the exposed surface of the multilayer wiring board 44 with a solder resist layer 42 except for part of the pad 12 to be bonded to an external connection terminal. Thus, in the case where a plurality of patterned wiring line layers 34, 36 are formed on only one side of the core substrate 29, removal of the conductor substrate 10 is not necessary until all of the wiring line patterns are formed. This process for forming a plurality of patterned wiring line layers 34, 36 while supporting the core substrate 29 by the conductor substrate 10 has an advantage of enabling the multilayer wiring board 44 to be securely supported in the course of the production thereof to thereby improve its dimensional stability.

In the multilayer wiring board 44 shown in FIG. 2D, the core substrate 29 has a skeleton made up of the via columns 26' and the conductor structural members 28' and, accordingly, has a high stiffness by itself, and imparts good heat dissipation properties to the multilayer wiring board 44. Using a resin material having good heat resistance for the insulating structural member 20, it is possible to enhance the reliability of the core substrate 29.

In the embodiment as described above, since photolithography using a photosensitive resist is used for the formation of the patterned resist film 24 prior to the formation of the via columns 26' by plating, the via columns 26' can be formed at a much higher density and with a much higher precision compared with the conducting members of prior art formed on the inside wall of a piercing hole, which is opened by drilling or laser beam machining with poor processing precision. In addition, according to the invention, a multilayer wiring board comprising a core substrate having many conducting members (via columns 26') can be efficiently produced because a set of conducting members can be made in one lot.

Also in the embodiment as described above, the via base 18 is provided between the pad 12 and the via column 26'. Although the via base 18 does not have a characteristic effect on the electrical connection between the pad 12 and the patterned wiring line layers 34, 36, it enhances engagement between the conducting member consisting of the via base 18 and the via column 26' and the insulating structural member 20 because its diameter is smaller than that of the via column 26', as seen in FIGS. 2A to 2D.

In the multilayer wiring board 44 shown in FIG. 2D, although the via columns 26' of the core substrate 29 are all connected with the member of the patterned wiring line layer 34 adjacent to the core substrate 29, the via column 26' may be connected with a member of the patterned wiring line layer 36 remote from the core substrate 29.

In the embodiment as described above, although an aluminum sheet is used as the conductor substrate 10, it is also possible to use a supporting substrate having a conductor layer formed on a substrate of electrically insulating material, such as a substrate made of resin, in order to form a core substrate.

Figure 3A:
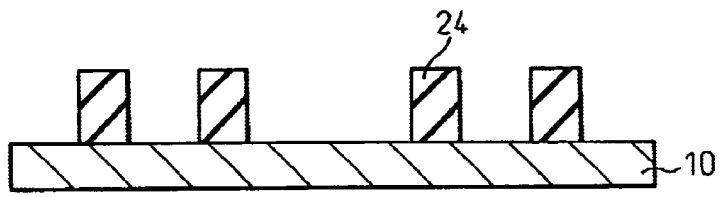
FIGS. 3A to 3C show the production of another core substrate.
Figure 3B:
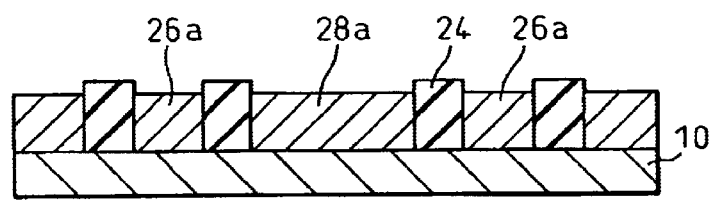
Figure 3C:
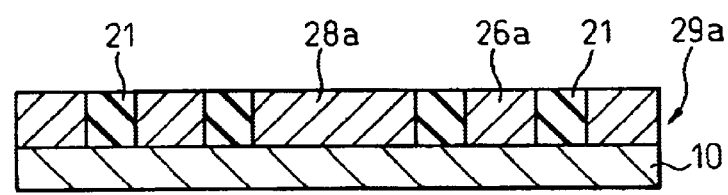

FIGS. 3A to 3C show another embodiment for the formation of a core substrate using a conductor substrate 10. In this embodiment, unlike the former embodiment in which the pads 12 are formed to be connected to an external connection terminal, a core substrate is formed from the very first on the conductor substrate 10.

As shown in FIG. 3A, a patterned resist layer 24 is first formed on a surface of the conductor substrate 10. Subsequently, via columns 26a and conductor structural members 28a are formed by plating with copper using the conductor substrate 10 as an electrical power supply layer, as shown in FIG. 3B.

The resist layer 24 is then removed, and an insulating structural member 21 is formed by applying a liquid insulating resin to or laminating a film of insulating resin onto the face of the core substrate 10 provided with the via columns 26a and conductor structural members 28a, to thereby fill the spaces which are not occupied by the via columns 26a and conductor structural members 28a with the resin material, and chemically, physically and/or mechanically removing the resin material covering the end faces of the via columns 26a and conductor structural members 28a to expose them, as shown in FIG. 3C. The removal of the resin material also serves for the planarization of the insulating structural member 21 as well as the via columns 26a and conductor structural members 28a.

Subsequently, the conductor substrate 10 is removed by etching, to thereby leave a core substrate 29a having a planarized configuration composed of the via columns 26a, the conductor structural members 28a, and the insulating structural member 21.

Figure 4:
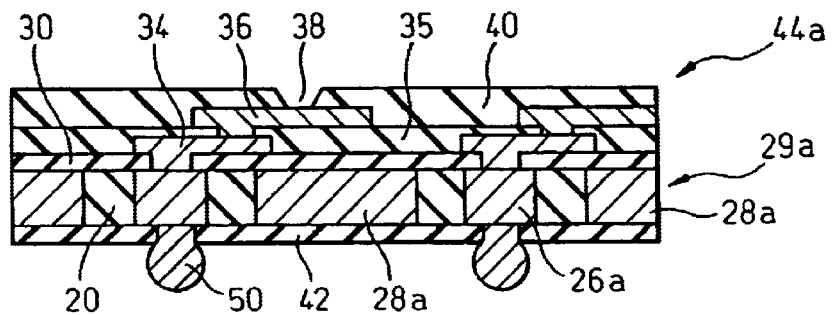
FIG. 4 illustrates an embodiment of the multilayer wiring board of the invention, FIGS. 5A to 5E schematically show the first half of the production of a core substrate having two layers each comprising via columns and conductor structural members for a multilayer wiring board of the invention, FIGS. 6A to 6D schematically show the second half of the production of a core substrate for a multilayer wiring board of the invention.

FIG. 4 shows an embodiment of the multilayer wiring board produced using the core substrate 29a thus obtained. This multilayer wiring board 44a has a face on which one or more semiconductor elements are mounted, and another face to be connected to an external electrical circuit. On the side of the face mounting the semiconductor elements thereon, a plurality of sets of patterned insulating layers 30, 35 and patterned wiring line layers 34, 36 are successively formed, and a solder resist layer 40 is formed so as to have a pattern exposing portions 38 to be bonded to a pad of the semiconductor element subsequently mounted, as in the former embodiment. The other face to be connected to an external electrical circuit is covered with a solder resist layer 42 except for part of the via column 26a to be bonded to an external connection terminal, such as a terminal formed of a solder ball 50, for the connection with the external electrical circuit (not shown). The end face of the conductor structural member 28a may not be covered by the solder resist layer 42 so as to be exposed, as required.

The multilayer wiring board 44a shown in FIG. 4 may be produced using the core substrate 29a having the conductor substrate 10 as shown in FIG. 3C. In this case, the conductor substrate 10 can be removed after the formation of the insulation layers 30, 35 and the wiring line layers 34, 36.

In the embodiments described above, the core substrate 29 or 29a used is composed of a layer comprising the via columns 26 or 26a and the conductor structural members 28 or 28a. In a further embodiment of the invention, it is also possible to use a core substrate having a plurality of layers each comprising via columns and conductor structural members. The production of such a core substrate will be described making reference to FIGS. 5 and 6.

Figure 5A:
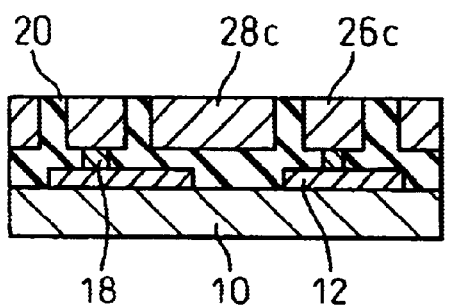
Figure 5B:
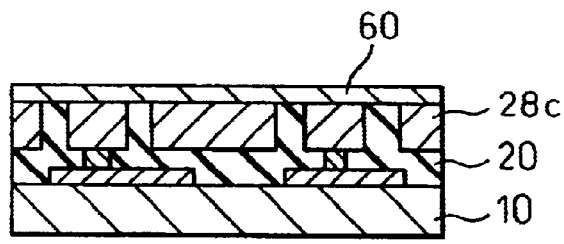
Figure 5C:
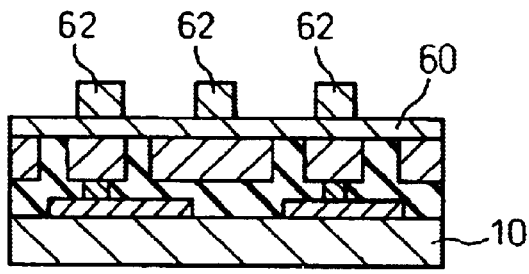

As shown in FIG. 5A, which corresponds to FIG. 1I for the former embodiment, a first layer comprising via columns 26c, conductor structural members 28c and an insulating structural member 20 is formed on a conductor substrate 10 provided with stacks of pads 12 and via bases 18. A conductor layer 60 is then formed on the surface of the first layer, as shown in FIG. 5B. The conductor layer 60 may be formed by electroless plating or by sputtering with copper, as in the former embodiment.

Precursor intermediate vias 62 (FIG. 5C) are then formed on the conductor layer 60 by forming a patterned resist layer (not shown) on the conductor layer 60 having openings so as to expose parts of the conductor layer 60, plating the exposed parts of the conductor layer 60 with copper using the conductor layer 60 as an electrical power supply layer, and removing the resist layer to expose parts of the conductor layer 60 which are not covered with the precursor intermediate vias 62 thus formed. The precursor intermediate vias 62 will electrically connect the via column 26c of the first layer with a via column of a second layer to be formed later, and will also electrically connect the conductor structural member 28c of the first layer with a conductor structural member of a second layer to be formed later. Each of the conductor structural members of the first layer is not necessarily connected with the conductor structural member of the second layer, and precursor intermediate vias 62 are not formed for the conductor structural members of the first layer which are not connected to the conductor structural member of the second layer. Thus, precursor intermediate vias 62 connecting the conductor structural members of the first and second layer are selectively formed.

Figure 5D:
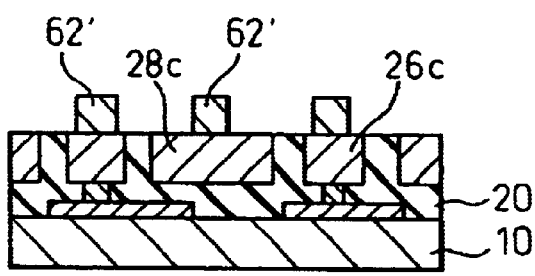
Figure 5E:
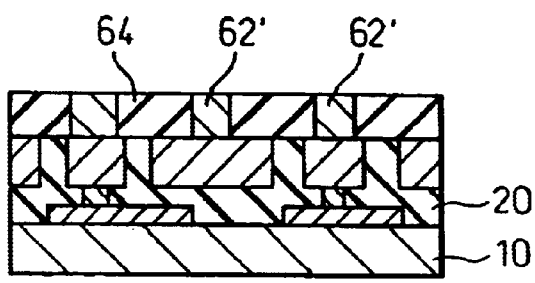

The side of the conductor substrate 10 having the precursor intermediate vias 62 is then etched. The etching is terminated when the exposed parts of the conductor layer 60 is completely removed, to leave finished intermediate vias 62' which are made up of the precursor intermediate via 62 (FIG. 5C) and the underlying part of the conductor layer 60 (FIG. 5C) and are electrically isolated from each other, as shown in FIG. 5D. An insulating layer 64 (FIG. 5D) is then formed by applying an insulating resin to the face of the core substrate 10 provided with the intermediate vias 62', to thereby fill the spaces, which are not occupied by the intermediate vias 62', with the resin material, and chemically, physically and/or mechanically removing the resin material covering the end faces of the intermediate vias 62' to expose them.

Figure 6A:
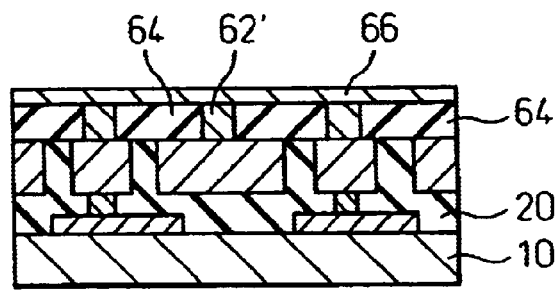

A conductor layer 66 is then formed to cover the surface of the insulation layer 64 and the end faces of the intermediate vias 62', as shown in FIG. 6A. The conductor layer 66 may be formed in the same manner as described for the formation of the conductor layer 60.

Figure 6B:
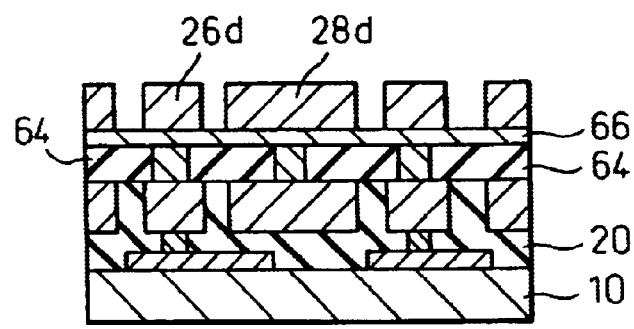
Figure 6C:
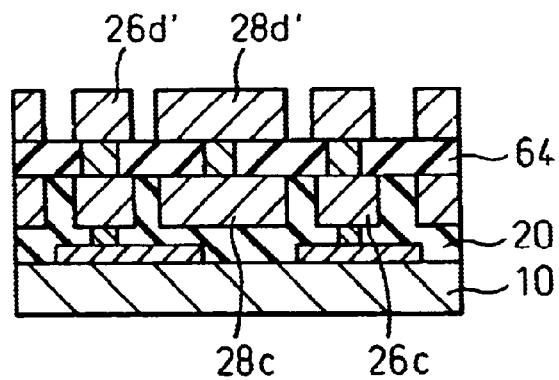

Precursor via columns 26d and precursor conductor structural members 28d of a second layer are then formed by forming a patterned resist film (not shown) on the conductor layer 66, electrolytically plating exposed parts of the conductor layer 66 with copper using the resist film as a mask and the conductor layer 66 as an electrical power supply layer, and then removing the resist film, as shown in FIG. 6B.

Subsequently, the side of the conductor substrate 10 having the precursor via columns 26d and the precursor conductor structural members 28d is etched. The etching is terminated when the exposed parts of the conductor layer 66 is completely removed, to provide finished individual via columns 26d' and individual conductor structural members 28d' (FIG. 6C) of the second layer which are electrically isolated from each other, without substantially affecting the thicknesses of the via columns 26d' and conductor structural members 28d', because the conductor layer 66 as an electrical power supply layer has a much smaller thickness than those of the precursor via columns 26d and precursor conductor structural members 28d, as earlier described. The via column 26d' is made up of the precursor via column 26d and the conductor layer 66 (FIG. 6B), and the conductor structural member 28d' is made up of the precursor conductor structural member 28d and the conductor layer 66 (FIG. 6B).

Figure 6D:
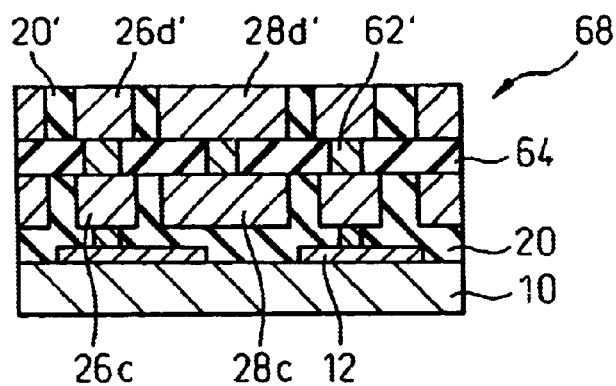

An insulating structural member 20' is then formed by applying an insulating resin, such as epoxy or polyimide, to the face of the conductor substrate 10 provided with the via columns 26d' and conductor structural members 28d' to form an insulator layer, and chemically, physically and/or mechanically removing the insulator material covering the end faces of the via columns 26d' and conductor structural members 28d' to expose them at the surface of the insulating layer, as shown in FIG. 6D.

In this way, a core substrate 68 having conducting members formed in two layers is obtained, each of the two layers comprising via columns 26c (or 26d') and conductor structural members 28c (or 28d'), which are embedded in the electrically insulating material of the insulating structural member 20 (or 20'). The via column 26c of the first layer is electrically connected to the via column 26d' of the second layer through the intermediate via 62', and, as required, the conductor structural member 28c of the first layer is also electrically connected to the conductor structural member 28d of the second layer through the intermediate via 62'.

As described above, the conductor structural member 28c of the first layer and the conductor structural member 28d' of the second layer may or may not be connected with each other through the intermediate via 62'. In the case where the conductor structural members 28c and 28d' of the first and second layers are connected with each other, the combination of them can be used as a power supply layer or a ground layer. In the case where the conductor structural members 28c and 28d' of the first and second layers are not connected, it is also possible to use one as a power supply layer and the other as a ground layer.

Thus, according to the invention, a core substrate having any number of layers each comprising conducting members can be formed, and conducting members of different layers can be discretionally interconnected.

Figure 7:
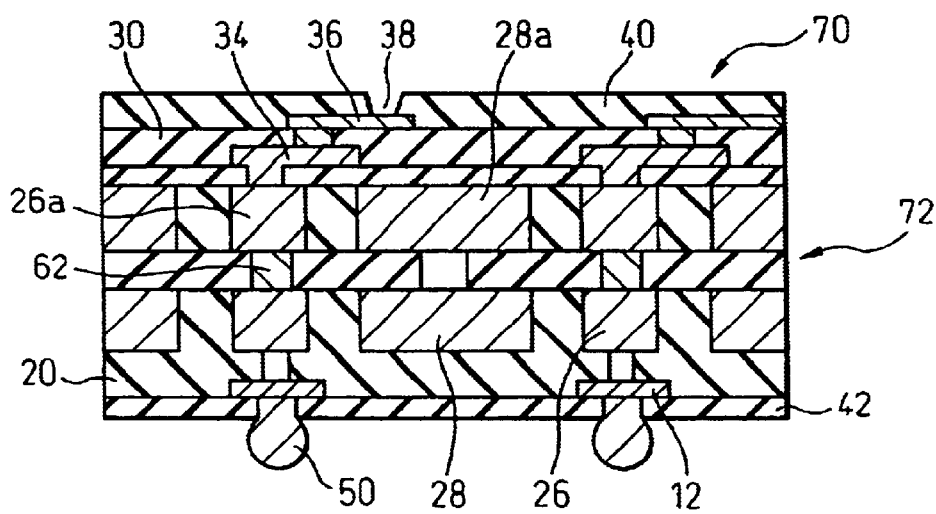
FIG. 7 illustrates another embodiment of the multilayer wiring board of the invention, and FIGS. 8A to 8C schematically show the production of a multilayer wiring board having a set of patterned wiring line layers on both faces thereof.

A further embodiment of the invention is illustrated in FIG. 7. A multilayer wiring board 70 of this embodiment uses a core substrate 72 having two layers each comprising conducting members. Two wiring line layers 34, 36 are formed on one side of the core substrate 72, the wiring line layers being separated from each other by an insulating layer 30. The surface of the upper wiring line layer is coated with a solder resist 40 so as to expose part of wiring line layer which is connected with a semiconductor element to be mounted on the multilayer wiring board 70. The other surface of the multilayer wiring board 70 is also coated with a solder resist layer 42 so as to expose part of a pad 12 which is bonded to an external connection terminal, such as a terminal formed of a solder ball 50, for the connection with the external electrical circuit (not shown).

A core substrate having two or more layers each comprising via columns and conductor structural members used in the invention has advantages in that at least one of the conductor structural members can be used as a power supply layer or a ground layer, and a combination of the layers each comprising the conductor structural members makes it possible to impart an increased strength to the core substrate.

In the case where both sides of a core substrate have a plurality of wiring line layers, a first set of wiring line layers is first created on a surface of a core substrate provided with a conductor substrate, as earlier described, and, after the removal of the conductor substrate, a second set of wiring line layers can be created on another surface of the core substrate, i.e., the surface from which the conductor substrate is removed. The second set of wiring line layers may be formed in the same manner as described for the formation of a set of wiring line layers on a core substrate provided with a conductive substrate making reference to FIGS. 2A to 2D.

Figure 8A:
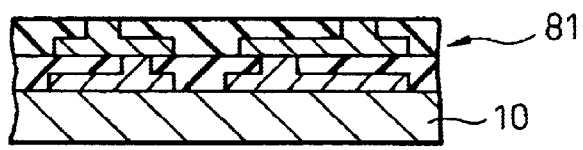
Figure 8B:
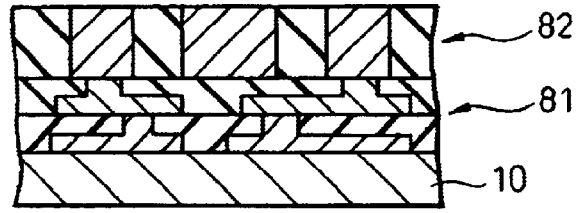
Figure 8C:
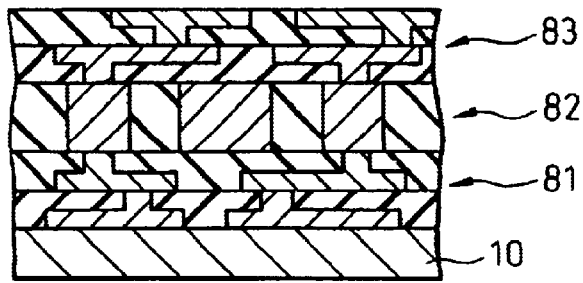

Alternatively, it is possible that, as illustrated in FIGS. 8A to 8C, a first set 81 of wiring line layers are first formed on a surface of a conductor substrate 10 (FIG. 8A), a core substrate 82 is then formed on the top wiring line layer (FIG. 8B), a second set 83 of wiring line layers are then formed on the surface of the core substrate 82 (FIG. 8C), and the conductor substrate is removed, to thereby produce a multilayer wiring board having a plurality of layers of wiring line pattern on both sides of the core substrate. A solder resist layer (not shown) is also formed on each of the surfaces of the sets 81, 83 of wiring line layers, as in the embodiments earlier described. In this case, the first set of wiring line layers may be formed following the manner described making reference to FIGS. 1H, 1I, and 2A to 2D, which starts with the formation of conductive members on a conductor layer for the formation of a plurality of wiring line layers. The core substrate may be formed following the manner described making reference to FIGS. 1F to 1I, which starts with the formation of a conductor layer on an underlayer for the formation of a core substrate. The second set of wiring line layers may be formed following the procedure illustrated in FIGS. 2A to 2D. The conductor substrate may be removed by etching, as in the embodiments earlier described. The etching of the conductor substrate uses, in general, an acidic or alkaline solution as an etchant, with the use of an alkaline solution being preferred.

As described, in the present invention, photolithography using a photosensitive resist is used for the formation of a patterned resist film, and via columns and conductor structural members are formed by plating using the resist film as a mask. Consequently, the via columns, through which electric or electronic elements or circuits, on both sides of a multilayer substrate fabricated using the core substrate, can be formed at a much higher density and with a much higher precision compared with conventional conducting members formed on the inside wall of a piercing hole, which is opened by drilling or laser beam machining. In addition, since the via columns of the invention are formed by plating, which makes it possible to form all the via columns of one layer together, a number of via columns can be efficiently formed. Furthermore, the conductor structural members of copper material makes it possible to enhance a strength of the core substrate, and, in the combination with the via columns also made of copper material, effectively improve heat dissipation of the core substrate.

What is claimed is:

1. A method of producing a multilayer wiring board having a core substrate and wiring line patterns formed on both faces of the core substrate, the core substrate having conducting members piercing through the core substrate, and members of the wiring line patterns on both faces of the core substrate being connected with each other through the conducting members piercing through the core substrate, wherein the core substrate comprises via columns and conductive structural members, which are formed by plating, and an insulating structural member, which electrically insulates the individual via columns and conductive structural members from each other, the via column piercing through the core substrate and serving as the conducting member for connecting the members of the wiring line patterns on both faces of the core substrate with each other, the method comprising the steps:

forming a patterned resist film on a surface of a conductor substrate, plating the surface of the conductor substrate provided with the patterned resist film using the resist film as a mask and the conductor substrate as an electrical power supply layer, to thereby form via columns and conductive structural members, removing the resist film, making a core substrate by forming a layer of insulating material on the surface of the conductor substrate so as to expose the top faces of the via columns and conductive structural members, the core substrate comprising the via columns, the conductive structural members, and an insulating structural member resulted from the layer of insulating material, forming, on the core substrate, a plurality of layers of wiring line patterns, each of which is separated from the underlying core substrate or layer of wiring line pattern by an insulating layer, and removing the conductor substrate.

2. The method of claim 1, wherein the via columns and conductive structural members are formed of copper.

3. The method of claim 1, wherein the conductor substrate is an aluminum sheet.

4. The method of claim 1, wherein the conductor substrate comprises a conductor layer and a substrate of electrically insulating material underlying the conductor layer.

5. The method of claim 1, wherein at least a member of the wiring line pattern is connected to the conductive structural member of the core substrate.

6. The method of claim 1, wherein, after the removal of the conductor substrate, a plurality of layers of wiring line pattern are formed on the surface of the core substrate from which the conductor substrate is removed.

7. A method of producing a multilayer wiring board having a core substrate and wiring line patterns formed on both faces of the core substrate, the core substrate having conducting members piercing through the core substrate, and members of the wiring line patterns on both faces of the core substrate being connected with each other through the conducting member piercing through the core substrate, wherein the core substrate comprises via columns and conductive structural members, which are formed by plating, and an insulating structural member, which electrically insulates the individual via columns and conductive structural members from each other, the via column piercing through the core substrate and serving as the conducting member for connecting the members of the wiring line patterns on both faces of the core substrate with each other, the method comprising:

forming a first set of layers of wiring line pattern on a surface of a conductor substrate, forming a core substrate on the top layer of wiring line pattern, forming a second set of layers of wiring line pattern on the surface of the core substrate, and removing the conductor substrate.

* * * * *